(12) United States Patent
Senoo

(10) Patent No.: US 9,613,703 B2
(45) Date of Patent: Apr. 4, 2017

(54) SEMICONDUCTOR MEMORY DEVICE

(71) Applicant: Winbond Electronics Corp., Taichung (TW)

(72) Inventor: Makoto Senoo, Tokyo (JP)

(73) Assignee: Winbond Electronics Corp., Taichung (TW)

( * ) Notice: Subject to any disclaimer, the term of this patent is extended or adjusted under 35 U.S.C. 154(b) by 101 days.

(21) Appl. No.: 14/462,584

(22) Filed: Aug. 19, 2014

(65) Prior Publication Data

US 2015/0117104 A1    Apr. 30, 2015

(30) Foreign Application Priority Data

Oct. 25, 2013   (JP) .................................. 2013-221698

(51) Int. Cl.
| | |
|---|---|
| *G11C 11/00* | (2006.01) |
| *G11C 16/10* | (2006.01) |
| *G11C 16/04* | (2006.01) |
| *G11C 16/06* | (2006.01) |
| *G11C 7/10* | (2006.01) |

(52) U.S. Cl.
CPC ............ *G11C 16/10* (2013.01); *G11C 7/1039* (2013.01); *G11C 16/0483* (2013.01); *G11C 16/06* (2013.01); *G11C 2207/005* (2013.01)

(58) Field of Classification Search
CPC .................................................. G11C 11/005
USPC ................................................... 365/189.011
See application file for complete search history.

(56) References Cited

U.S. PATENT DOCUMENTS

| | | | |
|---|---|---|---|
| 2003/0137865 A1* | 7/2003 | Thompson ............... | G11C 7/06 365/145 |
| 2006/0018159 A1* | 1/2006 | Picca ..................... | G11C 29/82 365/185.17 |
| 2006/0047888 A1 | 3/2006 | Nishihara et al. | |

(Continued)

FOREIGN PATENT DOCUMENTS

| | | |
|---|---|---|
| JP | 2006065533 | 3/2006 |
| JP | 2007115004 | 5/2007 |

(Continued)

OTHER PUBLICATIONS

"Office Action of Taiwan Counterpart Application," issued on Sep. 24, 2015, p. 1-p. 7.

(Continued)

*Primary Examiner* — Min Huang
(74) *Attorney, Agent, or Firm* — Jianq Chyun IP Office

(57) ABSTRACT

A semiconductor memory device for high speed operation, and for flexible data reading and programming is disclosed. The flash memory of the present disclosure includes: a page buffer/sensor circuit including a volatile memory element that may maintain data with a size corresponding to a page of a memory array; a high speed cache register including a non-volatile memory element that may maintain data with a size corresponding to a page of a memory array. The page buffer/sensor circuit includes a sensor circuit, a data register, and a transmission gate. The data register may transmit and receive data with an input-output buffer. The high speed cache register includes RRAM, wherein the RRAM may transmit and receive data with an input-output buffer via a transmission gate, and may transmit and receive data with the data register via a transmission gate.

9 Claims, 10 Drawing Sheets

(56) References Cited

U.S. PATENT DOCUMENTS

| | | | |
|---|---|---|---|
| 2006/0087893 A1* | 4/2006 | Nishihara | G06F 12/0246 365/145 |
| 2007/0091679 A1 | 4/2007 | Nishihara et al. | |
| 2007/0091707 A1* | 4/2007 | Hidaka | G11C 11/005 365/230.03 |
| 2007/0177432 A1 | 8/2007 | Spall et al. | |
| 2008/0104329 A1 | 5/2008 | Gaither et al. | |
| 2008/0123411 A1* | 5/2008 | Crippa | G11C 7/1021 365/185.03 |
| 2009/0063787 A1* | 3/2009 | Gower | G06F 13/1668 711/149 |
| 2009/0168528 A1 | 7/2009 | Park | |
| 2009/0210612 A1 | 8/2009 | Nakanishi et al. | |
| 2010/0195394 A1 | 8/2010 | Park | |
| 2010/0329011 A1* | 12/2010 | Lee | G11C 7/1075 365/185.17 |
| 2011/0141809 A1 | 6/2011 | Yang et al. | |
| 2012/0155197 A1 | 6/2012 | Joo | |

FOREIGN PATENT DOCUMENTS

| | | |
|---|---|---|
| JP | 2007213806 | 8/2007 |
| JP | 2008117388 | 5/2008 |
| JP | 2009217755 | 9/2009 |
| JP | 2013118031 | 6/2013 |
| KR | 100823175 | 4/2008 |
| KR | 1020090090846 | 8/2009 |

OTHER PUBLICATIONS

"Office Action of Korea Counterpart Application," issued on Nov. 24, 2015, with English translation thereof, p. 1-p. 7.

"Office Action of Korea Counterpart Application," issued on May 27, 2016, p. 1-p. 7, with English translation thereof.

* cited by examiner

Programming operation

Reading operation

| | Erasing | Writing | Reading |
|---|---|---|---|
| Selection W/L | 0 | 15~20V | 0 |
| Non-selection W/L | F | 10V | 4.5 |
| SGD | F | Vcc | 4.5 |
| SGS | F | 0 | 4.5 |
| SL | F | Vcc | 0 |
| P well | 18 | 0 | 0 |

Page programming without the cache

Page reading without the cache

Transmitting the data

SEMICONDUCTOR MEMORY DEVICE

CROSS-REFERENCE TO RELATED APPLICATION

This application claims the priority benefit of Japan application serial no. 2013-221698, filed on Oct. 25, 2013. The entirety of the above-mentioned patent application is hereby incorporated by reference herein and made a part of this specification.

BACKGROUND OF THE INVENTION

Field of the Invention

The disclosure is directed to a semiconductor memory device, such as an NAND-type flash memory, and more particularly, to a page buffer using a non-volatile memory.

Description of Related Art

Generally, an NAND-type flash memory includes a memory array composed of a plurality of NAND strings formed by a plurality of memory cells connected in series, and a page buffer connected to bit lines of the memory array. The page buffer maintains data transmitted from a page selected from the memory array or data to be programmed to the selected page. A flash memory having a page buffer including a data register and a cache register for achieving high-speed data reading and programming is disclosed. (Refer to reference patent 1)

PRIOR PART

Reference Patent

[Reference patent 1] Japanese publication No. 2013-118031

In a conventional NAND-type flash memory, the page buffer utilized to maintain the page data selected from the memory array or maintain page data written into the memory array is a volatile circuit, such as a latch circuit including a complementary metal oxide semiconductor (CMOS) inverter.

FIG. 1 is a schematic diagram for illustrating the operation of a page buffer/sensor circuit of a conventional flash memory. A page buffer/sensor circuit 10 includes a sensor circuit 12, a data register 14, a cache register 18 and a transmission gate 20. The sensor circuit 12 is connected with each bit line BL of the memory array through a bit line selection transistor BSEL. The data register 14 maintains data sensed by the sensor circuit 12 or maintains data used for programming. The transmission gate 16 may perform bidirectional data transmission with the data register 14. The cache register 18 is connected with the transmission gate 16. The transmission gate 20 may perform bidirectional data transmission between the cache register 18 and a data line facing toward an input-output (TO) buffer.

FIG. 2(A) and FIG. 2(B) are flowcharts illustrating programming and reading operations performed by the page buffer. In the NAND-type flash memory, the programming and the reading operations are performed by using a page as a unit. In the programming operation, program data received by an IO buffer (not shown) is input into the cache register 18 through the data line and the transmission gate 20 (step S100), and the input program data is transmitted to the data register 14 through the transmission gate 16 (step S102). The sensor circuit 12 sets a potential for the bit lines according to the program data maintained by the data register 14, an appropriate voltage is applied to each word line of the selected page and performs the programming operation on the memory array MA (step S104).

In the reading operation, the data of the page selected from the memory array MA is sensed by the sensor circuit 12 through the bit lines (step S110), and the sensed data is maintained in the data register 14 (step S112). The maintained data is transmitted to the cache register 18 through the transmission gate 16 and then output from the cache register 18 to the IO buffer through the transmission gate 20 (step S114).

Due to containing a volatile memory element, such as the latch, the conventional page buffer/sensor circuit 10 has the following issues.

First, if being formed by the CMOS latch circuit, an area of the page buffer will be increased, which leads to failure in achieving miniaturization of the flash memory.

Second, due to the volatility of the page buffer, the data will be lost if the power is off. For example, when the power is on again, in a scenario where the data read or programmed before the power is off is needed to refer, an issue that the memory array has to be accessed due to none of the data stored in the page buffer will occur.

Third, in the NAND-type flash memory, the reading or the programming operation is performed by using a page as a unit. If data with a size smaller than one page is continuously programmed to the same page, the utilization rate for each page may be increased, and the time for selecting the page may be saved to shorten programming time, but on the other hand, the number of continuously programming the same page is limited. In a flash memory having memory cells storing binary data, the number of continuously programming the same page is limited to 4 times. This is because the word line of the page is applied with a high voltage repeatedly if the programming operation is performed for several times on the same page, which causes bad affection to a threshold value of the memory cells of a neighboring page. Thus, in case each page has 2 K bytes, one page may be continuously programmed for 4 times, and data of 512 bytes is programmed each time. In other words, in a scenario where the data has a size smaller than 512 bytes, the page cannot be entirely programmed even though the same page is continuously programmed. Thereafter, if the size of the page becomes greater, the minimum size of the data for achieving entirely programming the page by means of continuously programming the same page becomes greater.

SUMMARY

Accordingly, the disclosure provides a semiconductor memory device capable of high speed operation and flexible data reading and programming.

The semiconductor memory device includes a memory array, a selection means, a data maintaining means, an input-output (IO) means and a control means. The memory is formed by plurality of memory elements. The selection means selects a page for the memory array. The data maintaining means is assembled to the memory and maintains data read from the target page in the memory array or data programmed to the selected page. The IO means receives data input from the external or data to be output to the external. The control means controls data reading and data programming. The data maintaining means includes a first maintaining portion, a second data maintaining portion, a first data transmission means and a second data transmission means. The first maintaining portion includes a volatile memory element maintaining data with a size corresponding to the page of the memory array. The second data maintaining portion includes a non-volatile memory element maintaining data with a size corresponding to the page of the memory array. The first data transmission means is connected between the first data maintaining portion and the IO means and performs bidirectional data transmission. The second data transmission means is connected between the second data maintaining portion and the IO means and perform is bidirectional data transmission. The data transmission performed by the first and the second data transmission is controlled by the control means.

Preferably, the data maintaining means further comprises a third data transmission means. The third data transmission means is connected between the first data maintaining portion and the second data maintaining portion and performs bidirectional data transmission. The third data transmission means is controlled by the control means. Preferably, the control means controls the first data transmission means, the second data transmission means and the third data transmission means according to a command received from the external. Preferably, the control means controls the data stored in the second data maintaining portion to be programmed to the target page in the memory array when the data programmed to the target page is set by the second data maintaining portion. Preferably, the control means controls the data stored in the second data maintaining portion to be output to the IO means through the second data transmission means when the data of the target page is stored by the second data maintaining portion. Preferably, the control means controls the data read from the target page in the memory array to be output to the IO means and controls the second data maintaining portion to maintain the data when the data of the target page is not stored by the second data maintaining portion. Preferably, the control means controls the data maintained by the first data maintaining portion to be output to the IO means through the first data transmission means. Preferably, the second data maintaining means is formed by a storage element including a resistance random access memory (RRAM).

Accordingly, in the disclosure, the data stored by the second data maintaining portion can be accessed by means of the second data maintaining portion included in the data maintaining means which is assembled to the memory array being an non-volatile memory element, and thus, when being compared with a scenario of accessing the memory array, the high-speed characteristics, such as high-speed data reading can be achieved. Moreover, a user can be flexibly provided with the data reading and programming operation as demanded through the bidirectional data receiving and transmitting which are carried out among the first data maintaining portion, the second maintaining portion and the IO means.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
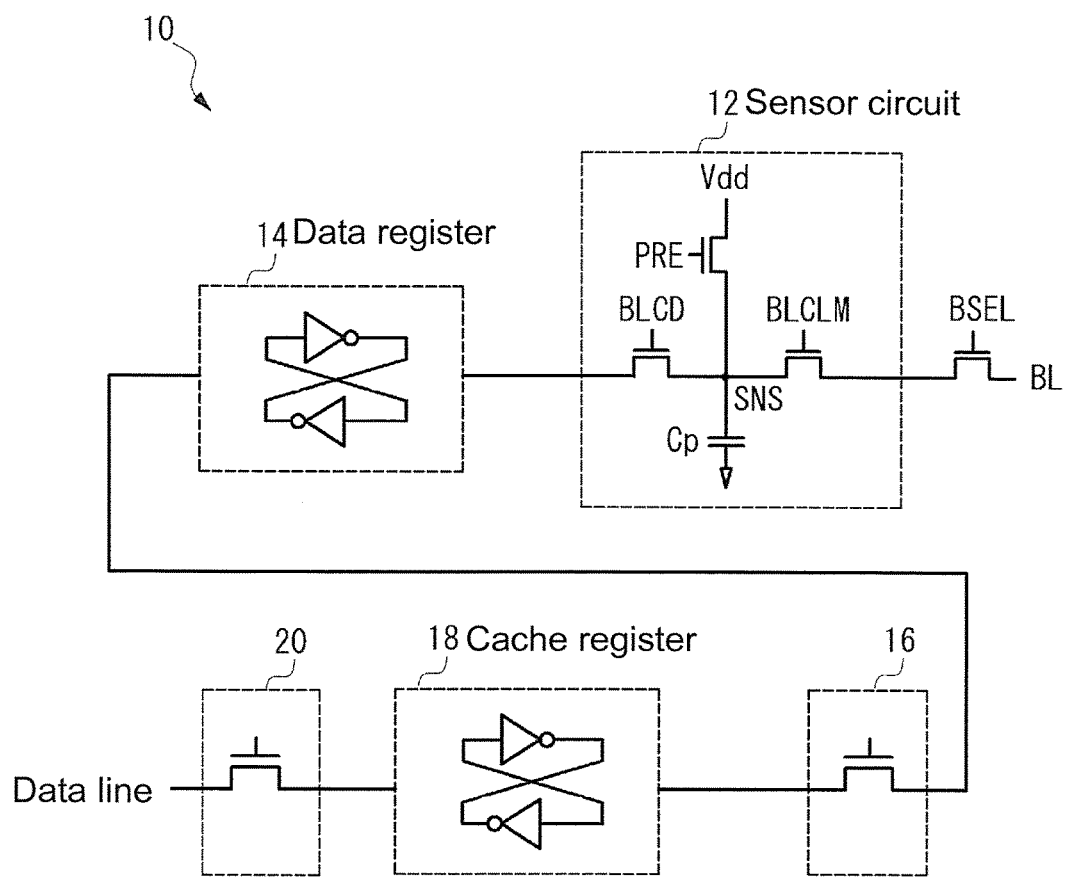
FIG. 1 is a schematic diagram for illustrating the operation of a page buffer/sensor circuit of a conventional flash memory.
Figure 2A:
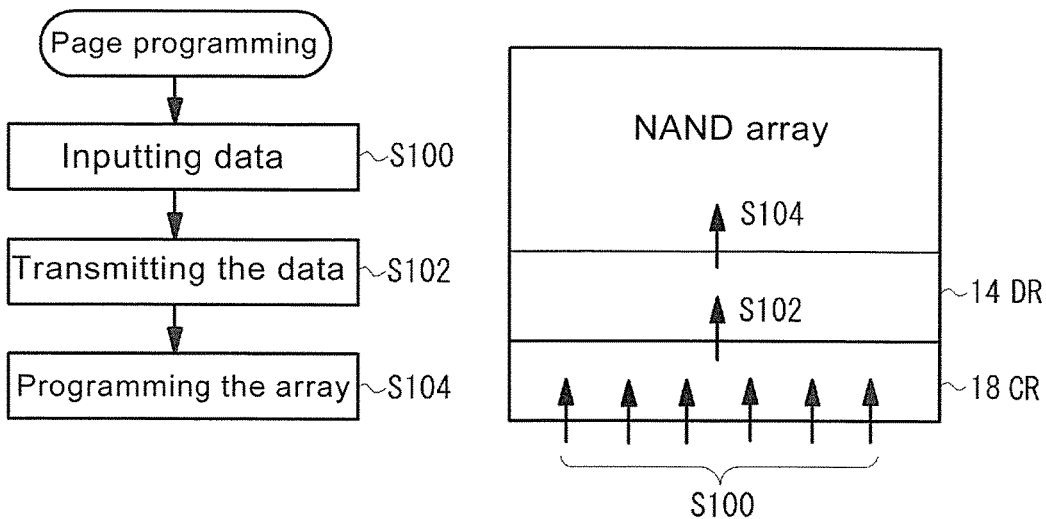
FIG. 2(A) and FIG. 2(B) are flowcharts of the page buffer/sensor circuit of the conventional flash memory performing programming and reading operations.
Figure 2B:
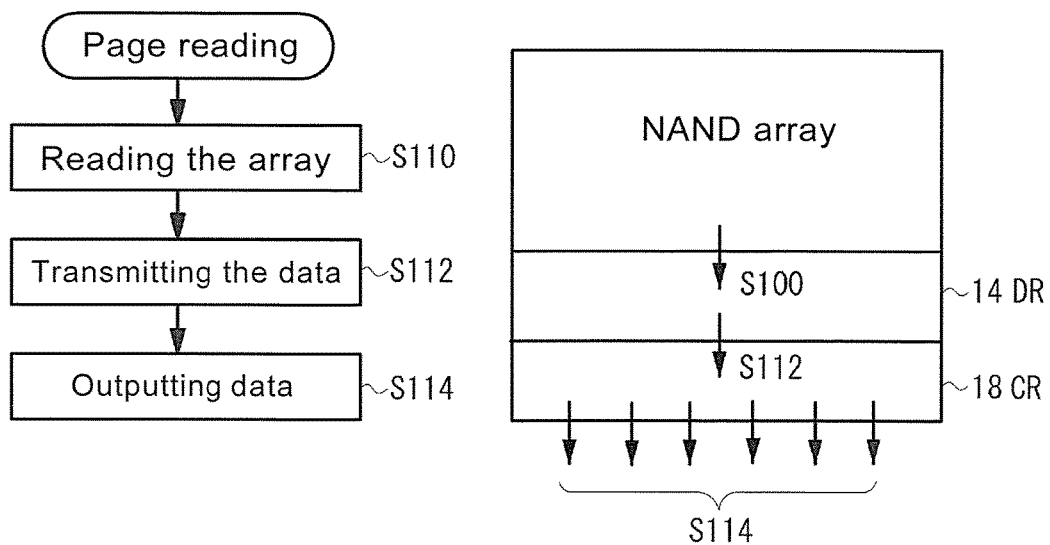

Hereinafter, embodiments of the disclosure are illustrated in detail with reference to the accompanying drawings. Additionally, it should be noted that the accompanying drawings are provided with each part being emphasized for comprehensive understanding, and in the drawings, the parts are presented in different ratios from actual parts.

Figure 3:
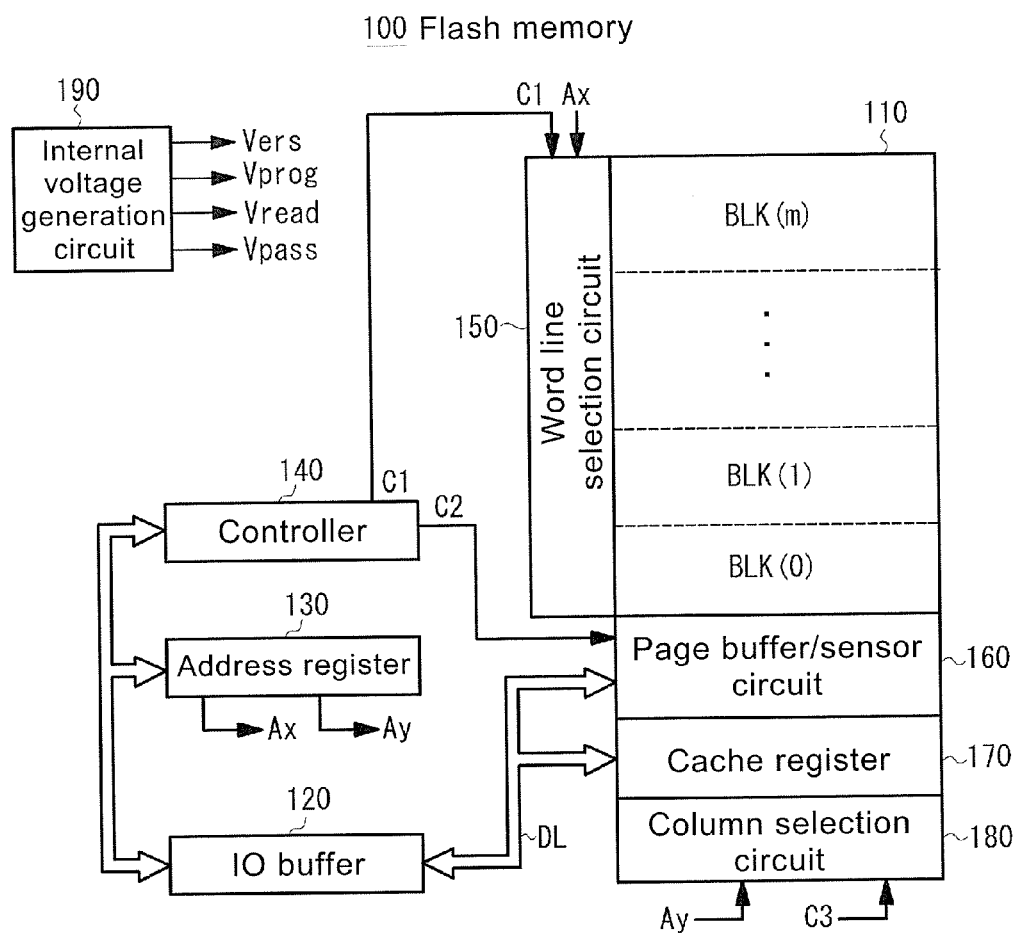
FIG. 3 is a block diagram illustrating an example of a flash memory according to one embodiment of the disclosure.

FIG. 3 is a block diagram illustrating an example of a flash memory according to one embodiment of the disclosure. However, the structure illustrated herein is only an example, and the flash memory of the disclosure is not limited thereto.

In the present embodiment, a flash memory 100 is constituted of a memory array 110 formed by a plurality of memory units arranged in an array, an input-output (IO) buffer 120 connected with an external input/output terminal I/O and maintaining input/output data, an address register 130 receiving address date from the IO buffer 120, a controller 140 controlling each of the aforementioned parts according to command data from the IO buffer and an external signal (e.g., a command latch enable (CLE) signal, an address latch enable (ALE) or the like which is not shown), a word line selection circuit 150 for decoding row address information Ax from the address register 130 and selecting a block and a word line, a page buffer/sensor circuit 160 maintaining data read by a page selected by the selection circuit or maintaining data to be written to the selected page, a cache register 170 maintaining the data by using a non-volatile element, a column selection circuit 180 decoding column address information Ay from the address register 130 and selecting column data in the page buffer 160 and/or the cache register 170 according to the decoding result and an internal voltage generation circuit 190 generating voltages required for operations, such as data reading, data programming, data erasing and so on (e.g., a program voltage Vpgm, a pass voltage Vpass, a read-pass voltage Vread, an erase voltage Vers and so on). The IO buffer 120 is connected with the page buffer/sensor circuit 160 and the cache register 170 through a data line DL, and the data line DL may achieve receiving and transmitting of parallel data having a predetermined bit width (e.g., 8-bit or 16-bit).

The memory array 110 has a plurality of blocks BLK(0), BLK(1), and BLK (m) arranged along a column direction.

The page buffer/sensor circuit 160 is disposed at one end of the blocks. However, the page buffer/sensor circuit 160 may also be disposed at the other end or both ends of the blocks. In each block, a plurality of NAND string unit NU is formed by a plurality of memory cells that are connected in series.

Figures 4, 5:
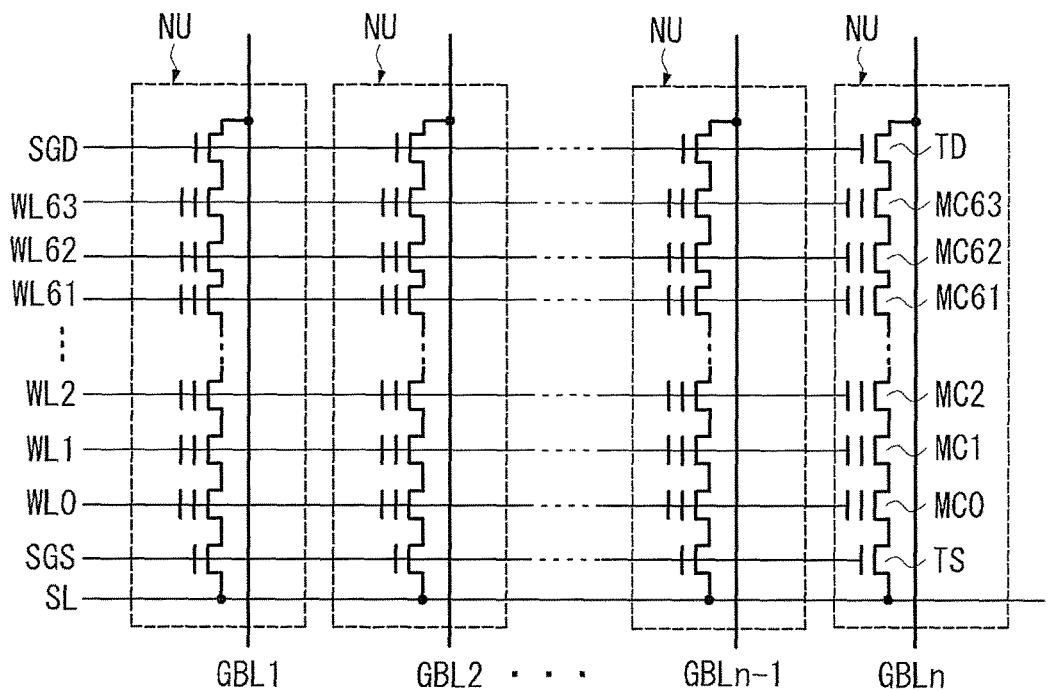
FIG. 4 is a structural diagram illustrating a circuit of a flash memory formed by NAND strings.
FIG. 5 is a table showing an example of voltages applied to the flash memory when performing various operations.

FIG. 4 is a circuit diagram illustrating an example of the NAND string units NU. Referring to FIG. 4, in each block, n NAND string units NU formed by a plurality of memory cells that are connected in series are arranged along a row direction. Each of the NAND string units NU includes a plurality of memory cells MCi (where i=0, 1, and 63) that are connected in series, a bit-line selection transistor TD and a source line selection transistor TS connected with two ends of the memory cells. A drain of the bit-line selection transistor TD is connected with a corresponding bit line GBL, and a source of the source line selection transistor TS is connected with a common source line SL. Control gates of the memory cells MCi are connected to word lines WLi, and gates of the selection transistors TD and TS are connected with gates lines SGD and SGS parallel to the word lines WL.

The word line selection circuit 150 conducts selection among the blocks and the word lines according to the row address information and applies voltages which corresponds to the operation to the selected word line/unselected word lines. Meanwhile, the word line selection circuit 150 selectively drives the transistors TD and TS through signals of the selection gate lines SGS and SGD. The bit lines GBL1 to GBLn are coupled to the page buffer/sensor circuit 160 through a bit line selection circuit.

Typically, the memory cells have a MOS structure. The MOS structure includes a source/drain which is an N-type diffusion region formed in a P well, a tunnel oxide film, formed on a channel between the source/drain, a floating gate formed on the tunnel oxide film and a control gate formed on the floating gate through an dielectric film. The P well is, for example, formed in an N well which is formed in a P-type silicon substrate. When charges are not accumulated on the floating gate, i.e., when written data is "1", a threshold value thereof is in a negative state, and the memory cells are normally on. When charges are accumulated on the floating gate, i.e., when the written data is "0", the threshold value becomes positive, and the memory cells are normally off. Meanwhile, the memory cells may be units for storing binary data and may also be units for storing multi-bit data.

FIG. 5 is a table showing an example of voltages applied to the flash memory when performing various operations. In a data reading operation, a positive voltage is applied to the bit lines, a certain voltage (e.g., 0 V) is applied to the selected word line, a read-pass voltage (e.g., 4.5 V) is applied to the unselected word lines, a positive voltage (e.g., 4.5 V) is applied to the selection gate lines SGD and SGS, the bit line selection transistor TD and the source line selection transistor TS are turned on, and a voltage of 0 V is applied to the common source line. In a programming (writing) operation, a high-level program voltage Vprog (e.g., 15 to 20 V) is applied to the selected word line, an intermediate-level voltage (e.g., 10 V) is applied to the unselected word lines, the bit line selection transistor TD is turned on, the source line selection transistor TS is turned off, and a voltage at a level corresponding to the data of "0" or "1" is provided to the bit lines GBL. In an erase operation, a voltage of 0 V is applied to the selected word lines within the blocks, a high-level voltage (e.g., 18 V) is applied to the P well, and the selection gate lines SGD and SGS are floated.

Figure 6:
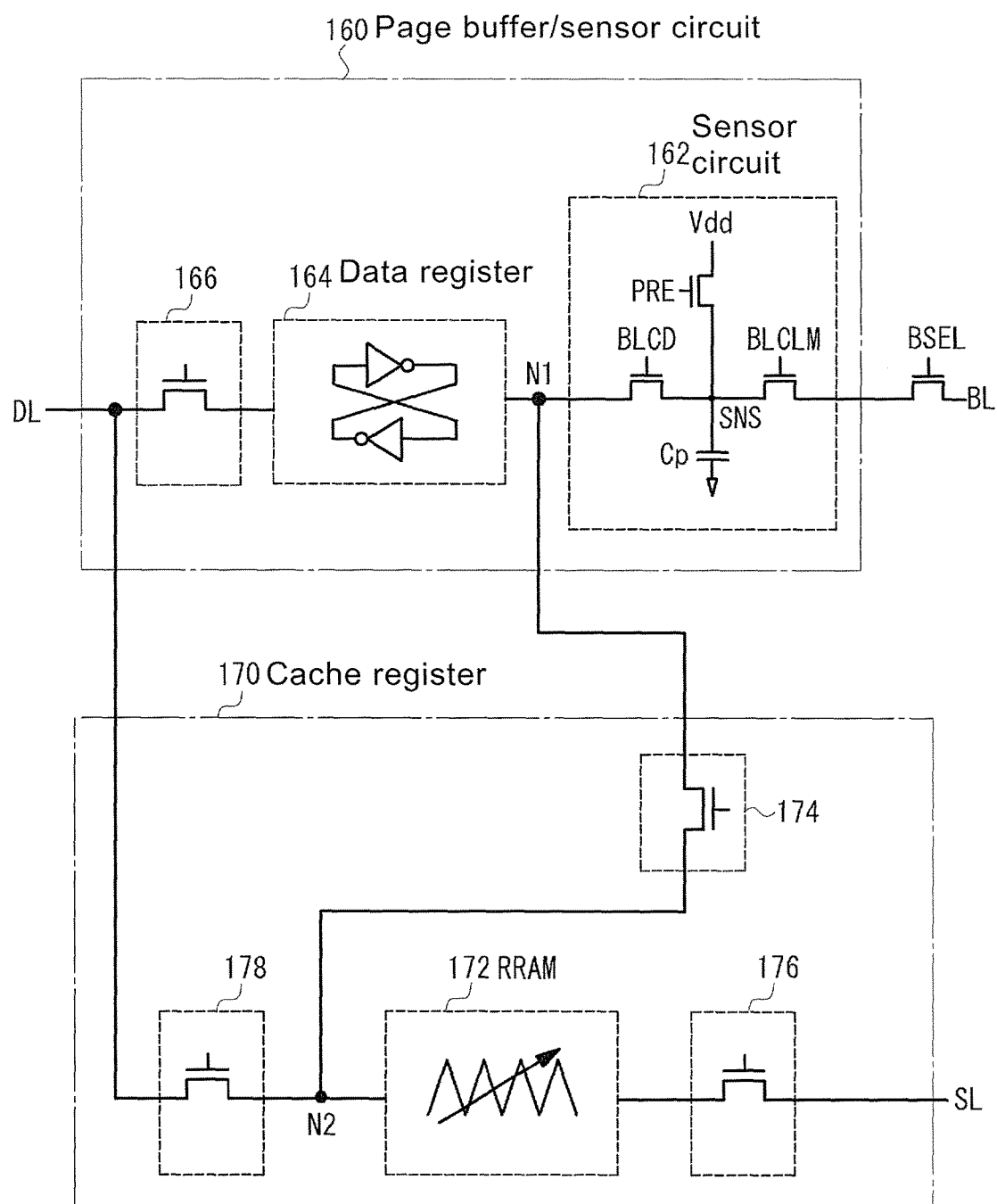
FIG. 6 is a structural diagram of a page buffer/sensor circuit and a cache register according to an embodiment of the disclosure.

FIG. 6 is a structural diagram of the page buffer/sensor circuit and a cache register according to an embodiment of the disclosure. Referring to FIG. 6, the page buffer/sensor circuit 160 is connected to the bit lines GBL0 to GBLn located in the memory array through a bit-line selection transistor of the bit-line selection circuit. It should be noted here that the page buffer/sensor circuit 160 of the disclosure includes the sensor circuit 162 and the data register 164 like the way the conventional art does, but does not include the volatile cache register 18 illustrated in FIG. 1. In the present embodiment, for instance, a non-volatile high-speed register 170 using a resistance random access memory (RRAM) is provided in replacement with the cache register 18.

The sensor circuit 162 and the data register 164 are preferably formed by a sensing element and a memory element containing bit numbers of each page. The sensor circuit 162 includes a clamp transistor BLCLM connected in series with a bit line through a bit line selection transistor, a pre-charge transistor PRE connected to a sensing node SNS, a capacitor Cp connected to the sensing node SNS and a transmission transistor BLCD connected between the sensing node SNS and the data register 164. The sensor circuit 162 has transistors which are N-type MOS transistors being selectively turned on or turned off according to a control signal from the controller 140. When the read operation is performed, the pre-charge transistor PRE is turned on, charges the selected bit lines through the clamp transistor BLCLM by using a pre-charge potential provided by a power source Vdd. The sensing node SNS maintains a potential of an H level or an L level that are read subsequently. The potential of the sensing node SNS is transmitted to the data register 164 through the transmission transistor BLCD, and a logic level corresponding to the potential of the sensing node SNS is maintained by the data register 164. When a programming operation is performed, a voltage corresponding to the data maintained by the sensor circuit 162 and the data register 164 is applied to the bit lines. The page buffer/sensor circuit 160 further includes transmission gate 166 between the data register 164 and the data line DL facing toward the IO buffer 120 so as to perform bidirectional data transmission between the data register 164 and the IO buffer 120. The transmission gate 166 includes an NMOS transistor connected in parallel with the number of bits in each page and the control signal from the controller 140 is input into each transistor to control transmission operations of the transistors.

The cache register 170 includes an RRAM 172, an access transistor 176 and transmission gates 174 and 178 that forms the number of bits in each page. The transmission gate 174 is connected between a node N1 which is formed between the sensor circuit 162 and the data register 164 and a node N2 of the RRAM 172. The transmission gate 178 is connected between the node N2 and the data line DL. The transmission gates 174 and 178 includes NMOS transistors connected in parallel with the number of bits in each page and the control signal is input from the controller 140 into the gates of the transmission gates 174 and 178 to control turning on or turning off (i.e., the transmission operation) of the transistors.

Figure 7:
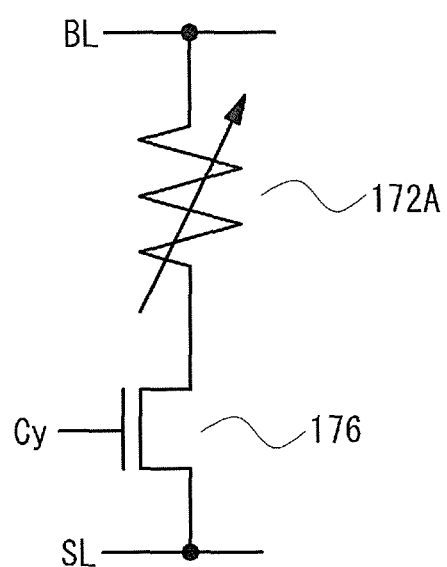
FIG. 7 illustrates an example of a resistance random access memory (RRAM) used in the cache register.

The RRAM 172 is formed by the following elements which are capable of varying resistance by using the dramatic change in the resistance resulted from applying the voltage and according to the direction of applying the voltage. FIG. 7 is structural diagram of the RRAM. The RRAM element includes a resistor element 172A having resistance varying with a direction and a level of a bias voltage and an access transistor 176 connected in series with the resistor element 172A which are located between the bit line BL and the source line SL. When a predetermined resistance value of the resistor element 172A is set, a specific bias voltage is applied from BL. When the resistance value of the resistor element 172A is reset, a specific bias voltage is applied from the source line SL. A gate of the access transistor 176 is connected to a selection signal Cy, and the selection signal Cy is provided from the column selection circuit 180. When the access transistor 176 is conducted on, a current flows between the bit line BL and the source line SL, and a value of the current corresponds to the resistance value of the resistor element 172A. For example, in a scenario where the bias voltage is applied to the resistor element 172A in a manner from the bit line BL to the source line SL, a specific potential is generated on the node N1. The source is, for example, connected to the ground, and in a scenario where the bias voltage is applied to the resistor element 172A in a manner from the source line SL to the bit line BL, the node N1 is connected to the ground, and a specific potential is generated on the source line SL. In this way, the RRAM 172 forms one memory cell by means of the resistor element 172A and the access transistor 176. The memory may be formed either by being arranged in a one dimension or by being arranged in two dimensions including columns and rows. For the later arrangement, row addresses are required in order to select the RRAM.

Due to the RRAM 172 being non-volatile, the data may be still maintained after the power supplied to the flash memory is cut off, and the data maintained by the cache register 170 may be used when the power is conducted to again. Additionally, the RRAM 172 has following advantages of having low power consumption since the data is rewritten by using the voltage (with a quite small amount of current), having a smaller unit area about 6F2 (F is a diameter of wiring, which is about several nanometers) due to having a relatively simple structure including one transistor and one resistor for achieving high density, and having a read time about 10 nanoseconds which is as fast as a dynamic random access memory (DRAM).

The PRAM 172 may be set/reset (i.e., the programming and erase operations of binary data) by using the controller 140, the word line selection circuit 150, the column selection circuit 180 and the sensor circuit 162. Nevertheless, a set/reset circuit dedicated to the RRAM 172 may also be configured.

The page buffer/sensor circuit 160 and the cache register 170 of the present embodiment includes the transmission gates 166 and 178 between the data register 170 and the data line DL facing toward the IO buffer 120, and which path selected to perform the data reading or programming operation may be determined according to a command received by the controller 140. The controller 140 controls the overall memory, including the transmission gates 166, 174 and 178 among the memory 110, the page buffer/sensor circuit 160 and the cache register 170, based on the command received from the external. The aforementioned control means may perform various operations, such as data reading, data programming and data erasing, preferably through programs configured in the internal memory.

For example, in a scenario where pages of the memory array are continuously read, in the same manner as the conventional art does, the data read from a selected page P1 is transmitted to the sensor circuit 162 through the bit line, while the data sensed by the sensor circuit 162 is maintained in the data register 164. In a period when the data read from a next selected page P2 is transmitted to the sensor circuit 162, the data maintained by the data register 164 is maintained by the RRAM 172 through the node N1 and the transmission gate 174. In a period when the data read from a further next selected page P3 is transmitted to the sensor circuit 162, the data maintained by the RRAM 172 is output to the data line DL (i.e., to the IO buffer 120) through the transmission gate 178, while the data maintained by the data register 164 is transmitted to the RRAM 172 through the transmission gate 174.

In an aspect of operation, the data maintained by the RRAM 172 may be output to the data line DL (i.e., to the IO buffer 120) through the transmission gate 178, while in contrary, the data input to the IO buffer may be stored in the RRAM 172 through the data line DL and the transmission gate 178.

In an aspect of operation, the data maintained by the data register 164 may be directly output to the data line DL (i.e., to the IO buffer 120) through the transmission gate 166, while in contrary, the data input to the IO buffer may be maintained by the data register 164 through the data line DL and the transmission gate 166.

Meanwhile, the controller 140 may perform a clear operation on the cache register 170. Preferably, the controller 140 may clear the cache register 170 when no cache hit of the cache register 170 is generated within a certain number of accessing of data programming or reading (e.g., 10 times). That is, the RRAM 172 is reset, such that the cache register 170 returns to a null state. Additionally, preferably, when the cache register 170 is to be cleared in a scenario where the page data is not written into the memory array, the clear operation will be performed on the cache register 170 after the data is written into the memory array. By doing so, when no cache hit is generated within a certain number of accessing, the cache register 170 may be more flexible by means of updating the content of the cache register 170 so as to enhance the cache hit.

Figure 8A:
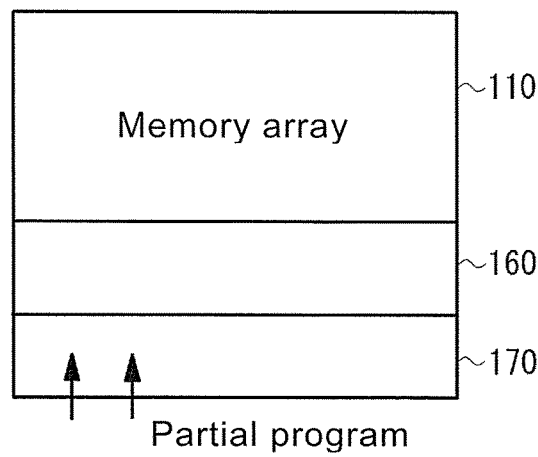
FIG. 8(A), FIG. 8(B) and FIG. 8(C) illustrate operations in scenarios where the cache register of the flash memory according to an embodiment of the disclosure is applied.

Subsequently, examples of operations by using the cache register of the flash memory of the embodiment will be described below. FIG. 8(A) illustrates an example where a number of data of a program is less than a page in the cache register and namely, partial program. The cache register 170, i.e., the memory element including the RRAM 172 with the bit number corresponding to each page, may program the data into a part of the RRAM 172. When receiving a command of partial program, the controller 140 controls each element according to the program. After the command of partial program, column addresses, row addresses and program data are received by the IO buffer 120, a column address for the RRAM 172 is selected by using the column selection circuit 180, the program data is transmitted from the IO buffer through the data line DL and the transmission gate 178, and a direction of the bias voltage applied to the RRAM 172 is determined, so as to determine whether to set or reset the resistor element. If assumed that the structure of the RRAM 172 is a two-dimensional array composed of columns and rows, the row addresses received when executing the partial program is used for selecting the row for the RRAM 172. Since the row addresses received when executing the partial program serves as information for determining whether to program the page same as the page selected from the memory array or not, the controller 140 previously stores the row address when programming the cache register 170 or the operation log thereof in the internal memory.

Figure 8B:
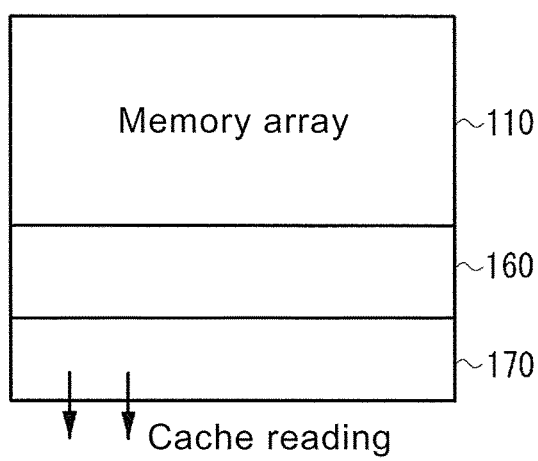

FIG. 8(B) illustrates an example of reading the data stored by the cache register 170. When receiving a cache read command, the controller 140 controls each element based on the command. Following the cache read command, the column address and the row address are then received by the IO buffer 120, the column address of the RRAM 172 is selected by using the column selection circuit 180, and the data read from the selected column address is output to the IO buffer 120 through the transmission gate 178.

The data may also be read from the cache register 170 based on an ordinary read command, and in such scenario, the controller 140 may determine whether the cache register is programmed by using the received column address and row address.

Figure 8C:
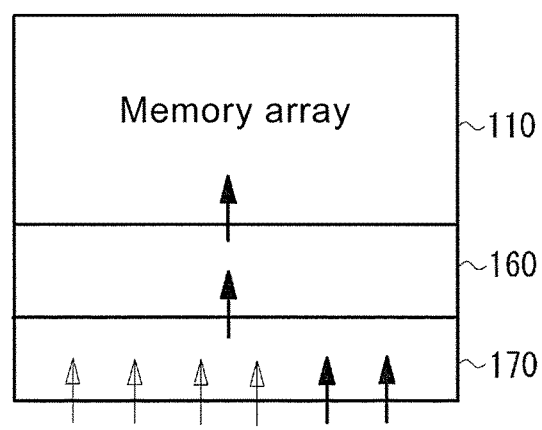
Figure 9:
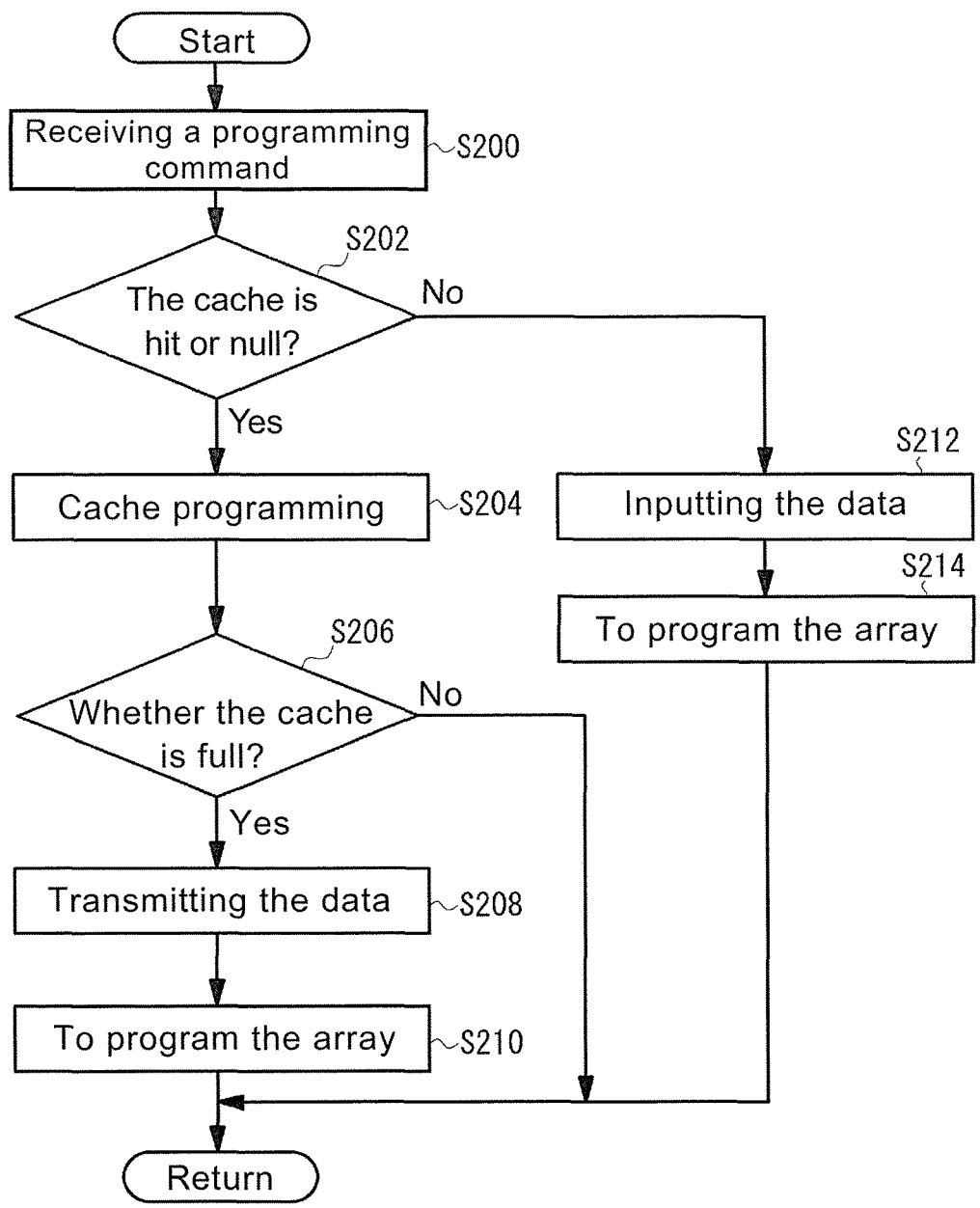
FIG. 9 is a flowchart of an example of a programming operation performed with the cache register of the memory according to an embodiment of the disclosure.

FIG. 8(C) illustrates an example of programming by using a page of the cache register 170. When a programming operation of cache programming one-page data by means of the partial program of the cache register 170 is finished, the data of one page of the cache register 170 is programmed to the page of the memory array. FIG. 9 is a flowchart used for describing process of FIG. 8(C).

A command of page programming by using cache is sent by a host computer from the external to the flash memory, the command is received by the controller 140 (step S200). The controller 140 determines whether the cache is hit, or the cache is null (step S202). That is to say, whether data programmed to the same page of the memory is programmed to the cache register 170 is determined depending on whether the cache is hit. In the determination, for the row addresses of the data programmed into the cache register 170, if the row addresses match, it is determined that the programming operation is performed on the same page.

When the determination of the controller 140 in step S202 is "Yes", the data input into the IO buffer 120 is programmed to the cache register 170 (step S204). Then, the controller 140 determines whether the cache register 170 is fully written due to the programming operation of the data, i.e., whether one-page data is programmed (step S20). If the data is fully written into the cache register 170, the data of the cache register 170 is transmitted to the node N1 through the transmission gate 174 (step S208), the data transmitted to the node N1 is maintained by the data register 164. Then, the sensor circuit 162 provides a potential corresponding to the data maintained by the data register 164 to the bit line BL, such that the programming operation on the selected page of the selected block in the memory array 110 is finished (step S210). On the other hand, when the determination result of step S202 is "No", the data of the IO buffer 120 is input into the data register 164 (S212) since it is the programming to the different page and the cache is not null, and then, the sensor circuit 162 provides the potential corresponding to the data maintained by the data register 164 to the bit line BL, such that the programming operation on the selected page of the selected block in the memory array 110 is finished (step S214).

The programming operation by using the cache register can prevent the number of continuously programming the same page from being limited, which is different from the conventional art. For example, when the number of continuously programming the same page is limited to 4 times, in the conventional programming operation, a data size of ¼ page becomes the smallest programming unit for fully writing one page. Comparing therewith, in the present embodiment, the data with a size smaller than one page may be programmed into the non-volatile cache register 170, and when the cache register is fully written, the data only requires to be programmed to the memory array. Thus, without being limited by the number of programming like an NAND string array, data with a desired size or data with a size smaller than ¼ page may be stored in the selected page of the memory array.

Figure 10A:
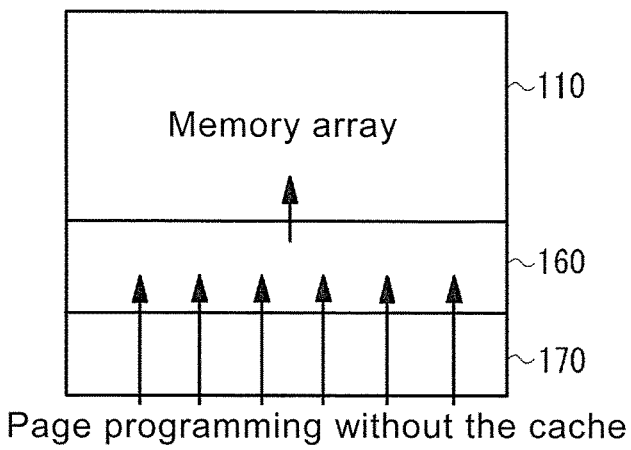
FIG. 10(A), FIG. 10(B) and FIG. 10(C) illustrate and example of operations in scenarios where the cache register of the flash memory of the disclosure is not applied.

Examples of operations without using the cache register of the flash memory of the embodiment will be described below. FIG. 10(A) illustrates a page programming operation without the cache. If receiving a command with respect to the page programming operation without the cache, the controller 140 transmits the data received by the IO buffer 120 to the data register 164 through the transmission gate 166, and the sensor circuit 162 performs page programming on the memory array according to the data maintained by the data register 164. Since the transmission does not go through the cache register 170, the time required for page programming may be shortened.

Figure 10B:
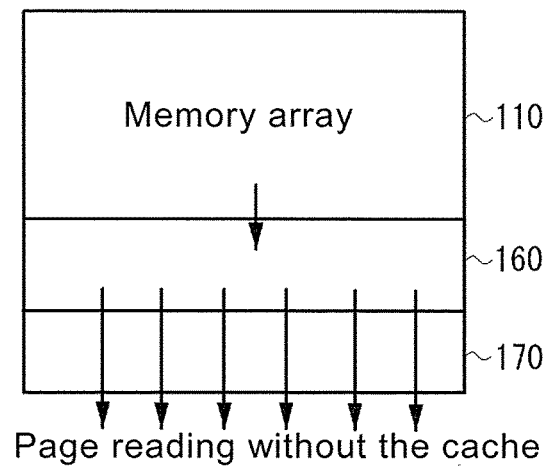

FIG. 10(B) illustrates an example of page reading without the cache. If receiving command, the controller 140 transmits the data read from the selected page of the memory array 110 to the data register 164 through the sensor circuit 162 and outputs the data maintained by the data register 164 directly to the IO buffer 120 through the transmission gate 166 and the data line DL.

Figure 10C:
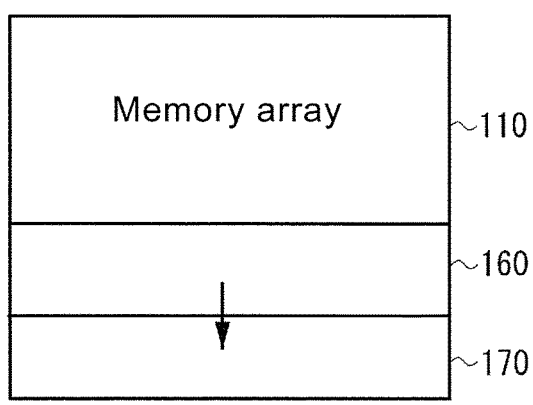

FIG. 10(C) illustrates an example of data transmission form the data register 164 to the cache register 170. In such scenario, the data maintained by the data register 164 is transmitted to the RRAM 172 through the node N1 and the transmission gate 174.

Figure 11:
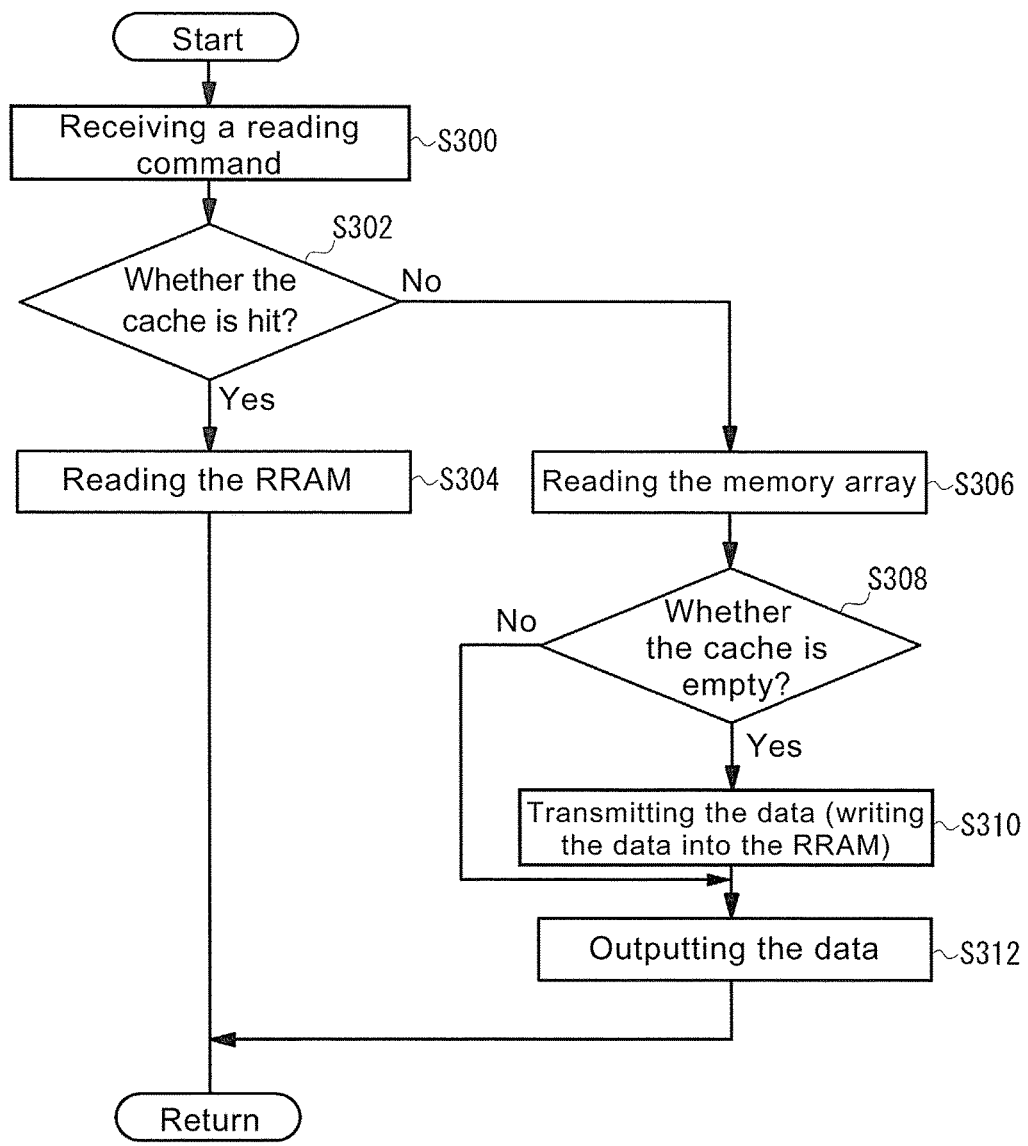
FIG. 11 is a flowchart of an example of the reading operation which is performed without the cache register of the flash memory of the disclosure.

FIG. 11 is a flowchart of an example of the reading operation of the present embodiment. If receiving the command (step S300), the controller 140 then determines whether the cache is hit (step S302). Whether the cache is hit refers to whether the data of the selected page is stored in the cache register. If the page programming operation is performed by using the cache in the manner illustrated in FIG. 8(C), it is possible that the data same as that stored in the memory array is stored in the cache register 170, and thus, the reading time of reading data from the cache register 170 may be shortened. Accordingly, when the result in step S302 is "Yes", the data stored in the cache register 170 is output to the IO buffer 120 through the transmission gate 178 (step S304).

On the other hand, when the cache is not hit, that is, the result in step S302 is "No", the data is read from the selected page in the memory array (step S306), and then, whether the cache register is empty is determined by using the controller 140 (step S308). In a scenario where the cache is null, the read data is programmed to the RRAM 172 through the transmission gate 174 (step S310) and output to the IO buffer 120 through the transmission gate 166. In a scenario where the cache is determined as no null, the read data is maintained by the data register 164 and output to the IO buffer 120 through the transmission gate 166 (step S312).

By doing so, according to the present embodiment, since the cache register includes the non-volatile RRAM, the flash memory may perform the reading operation in a high speed without accessing the memory array and may program the data with the desired size to the same page in the memory array as needed without being limited by the number of continuously programming the same page in the memory array.

Although the disclosure have been described in detail with reference to the preferred embodiments of, it will be apparent to one of the ordinary skill in the art that the invention is not limited to particular embodying manners, and modifications, variations and changes to the described embodiment may be made without departing from the spirit of the invention. Accordingly, the scope of the invention will be defined by the attached claims not by the above detailed descriptions.

What is claimed is:

1. A semiconductor memory device, comprising:
a memory array, formed by a plurality of memory elements;
a selection means, selecting a page from the memory array;
a data maintaining means, assembled to the memory array and maintaining data read from the page selected from the memory array or data programmed to the selected page;
an input-output (IO) means, receiving data input from an external or data to be output to the external; and
a control means, controlling data reading and data writing,
wherein the data maintaining means comprises:
- a first data maintaining portion, comprising a volatile memory element maintaining data with a size corresponding to the page of the memory array;
- a second data maintaining portion, comprising a non-volatile memory element maintaining data with a size corresponding to the page of the memory array;
- a sensor circuit, connected between the first data maintaining portion and the memory array, wherein the sensor circuit is configured to provide a potential corresponding to a write data to the memory array for writing the write data, wherein the sensor circuit is configured to sense a read data from the memory array for reading the read data, and the sensed read data is maintained in the first data maintaining portion;
- a first data transmission gate, connected between the first data maintaining portion and the IO means; and
- a second data transmission gate, connected between the second data maintaining portion and the IO means; and
- a third data transmission gate, connected between a first node and a second node, wherein the first node is between the first data maintaining portion and the sensor circuit, wherein the second node is between the second data maintaining portion and the second data transmission gate,
wherein the control means performs a data transmission by controlling the first data transmission gate, the second data transmission gate and the third data transmission gate.

2. The semiconductor memory device according to claim 1, wherein the control means controls the first data transmission gate, the second data transmission gate and a third data transmission gate according to a command received from the external.

3. The semiconductor memory device according to claim 1, wherein the control means controls the data stored in the second data maintaining portion to be programmed to the target page in the memory array when the data programmed to the page selected by the second data maintaining portion is set.

4. The semiconductor memory device according to claim 1, wherein the control means controls the data stored in the second data maintaining portion to be output to the IO means through the second data transmission gate when the data of the page selected by the second data maintaining portion is stored.

5. The semiconductor memory device according to claim 4, wherein the control means controls the data read by the page selected from the memory array to be output to the IO means and controls the second data maintaining portion to maintain the data when the data of the page selected by the second data maintaining portion is not stored.

6. The semiconductor memory device according to claim 1, wherein the control means controls the data maintained by the first data maintaining portion to be output to the IO means through the first data transmission gate.

7. The semiconductor memory device according to claim 1, wherein the second data maintaining portion is formed by a storage element comprising a resistance random access memory (RRAM).

8. The semiconductor memory device according to claim 1, wherein each of the first data transmission gate, the second data transmission gate and the third data transmission gate comprises a NMOS transistor connected in parallel with the number of bits in each page.

9. The semiconductor memory device according to claim 1, in the operation of the control means performs a data transmission by controlling the first data transmission gate, the second data transmission gate and the third data transmission gate,
the control means determines a status of the second data maintaining portion according to the data corresponding to the data transmission; and
the control means performs the data transmission by transmitting the data corresponding to the data transmission trough at least one of the first data transmission gate, the second data transmission gate and the third data transmission gate according to the determined status of the second data maintaining portion.

* * * * *